(12) United States Patent
Paz de Araujo et al.

(10) Patent No.: US 6,864,146 B2
(45) Date of Patent: Mar. 8, 2005

(54) METAL OXIDE INTEGRATED CIRCUIT ON SILICON GERMANIUM SUBSTRATE

(75) Inventors: Carlos A. Paz de Araujo, Colorado Springs, CO (US); Masamichi Azuma, Shiga (JP); Larry D. McMillan, Colorado Springs, CO (US); Koji Arita, Osaka (JP)

(73) Assignees: Symetrix Corporation, Colorado Springs, CO (US); Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/651,796

(22) Filed: Aug. 28, 2003

(65) Prior Publication Data

US 2004/0051129 A1 Mar. 18, 2004

Related U.S. Application Data

(60) Division of application No. 09/906,285, filed on Jul. 16, 2001, now Pat. No. 6,639,262, and a continuation-in-part of application No. 09/362,480, filed on Jul. 28, 1999, now Pat. No. 6,404,003, which is a continuation-in-part of application No. 08/165,082, filed on Dec. 10, 1993, now Pat. No. 6,285,048.

(51) Int. Cl.⁷ .............................................. H01L 21/20
(52) U.S. Cl. ...................................... 438/396; 438/240
(58) Field of Search ................................ 438/396, 240

(56) References Cited

U.S. PATENT DOCUMENTS 3,862,829 A 1/1975 Brandmayr et al.
4,347,167 A 8/1982 Payne et al.
4,743,953 A 5/1988 Toyokura et al.
5,046,043 A 9/1991 Miller et al.
5,122,923 A 6/1992 Matsubara et al.
5,146,299 A 9/1992 Lampe et al.
5,216,572 A 6/1993 Larson et al.
5,330,931 A 7/1994 Emesh et al.
5,504,041 A 4/1996 Summerfelt
5,519,234 A 5/1996 Paz de Araujo et al.
5,601,869 A 2/1997 Scott et al.
5,712,184 A 1/1998 Kaiser
6,285,048 B1 9/2001 Azuma et al.
6,303,520 B1 10/2001 Kwong et al.
6,387,810 B2 5/2002 Beardsley et al.

FOREIGN PATENT DOCUMENTS

EP 0655738 A2 7/1996
JP 06333772 12/1994

OTHER PUBLICATIONS

"Ceramic Materials for Electronics Processing, Properties, And Applications," Marcel Dekker, Inc., 1986, pp. 86–99.

(List continued on next page.)

*Primary Examiner*—Sara Crane
(74) *Attorney, Agent, or Firm*—Patton Boggs LLP

(57) ABSTRACT

Integrated circuit capacitors in which the capacitor dielectric is a thin film of BST having a grain size smaller than 200 nanometers formed above a silicon germanium substrate. Typical grain sizes are 40 nm and less. The BST is formed by deposition of a liquid precursor by a spin-on process. The original liquid precursor includes an alkoxycarboxylate dissolved in 2-methoxyethanol and a xylene exchange is performed just prior to spinning. The precursor is dried in air at a temperature of about 400° C. and then furnace annealed in oxygen at a temperature of between 600° C. and 850° C.

25 Claims, 4 Drawing Sheets

OTHER PUBLICATIONS

Vest, Robert W. et al., "PbTiO3 Films From Metalloorganic Precursors," IEEE Transaction On Ultrasonics, Ferroelectrics, And Frequency Control, vol. 35, No. 6, Nov. 1988.

McMillan, L.D. et al., "Deposition Of Ba 1–xSrxTiO3 And SrTiO3 Via Liquid Source CVD (LSCVD) For Ulsi Drams," Presented at ISIF Conference, 3/92.

Koyama, K. et al., "A Stacked Capacitor With (BaxSr1–x)TiO3 For 256M Dram," IEDM, 12/91.

Melnick, B.M. et al., "Process Optimization And Characterization Of Device Worthy Sol–Gel Based PZT for Ferroelectric Memories," Ferroelectrics, 1990 vol. 112, pp. 329–351, Gordon and Breach Science Publishers S.A.

Azuma, M. et al. "Electrical Characteristics Of High Dielectric Constant Materials For Integrated Ferroelectrics," 1992 ISIF, 3/92.

Vest, G.M. et al. "Synthesis Of Metallo–Organic Compounds for MOD Powders And Films,", 1986 Materials Research Society.

Mantese, J.V. et al., "Metalorganic Deposition (MOD): A Nonvacuum, Spin–on, Liquid–Based, Thin Film Method," MRS Bulletin, Oct. 1989.

METAL OXIDE INTEGRATED CIRCUIT ON SILICON GERMANIUM SUBSTRATE

RELATED APPLICATIONS

This application is a divisional application of application Ser. No. 09/906,285 filed Jul. 16, 2001, now U.S. Pat. No. 6,639,262 which application is a continuation-in-part of U.S. patent application Ser. No. 08/165,082 filed Dec. 10, 1993, now U.S. Pat. No. 6,285,048 issued Sep. 4, 2001, and is also a continuation-in-part of U.S. patent application Ser. No. 09/362,480 filed Jul. 28, 1999, now U.S. Pat. No. 6,404,003 issued Jun. 11, 2002.

BACKGROUND OF THE INVENTION

1. Field of the Invention

The invention in general relates to the fabrication of integrated circuits, and more particularly to the fabrication of capacitors and transistors utilizing a metal oxide, such as barium strontium titanate, as the dielectric on silicon germanium substrates.

2. Statement of the Problem

A crucial problem of ULSI (ultra-large-scale integration) DRAMs (dynamic random access memories) is how to provide sufficient storage capacitance in the small memory cell area available. In conventional DRAMs, this problem is addressed by providing capacitors with highly complex structures to maximize the area of the capacitor. Such complex capacitors require complex fabrication processes, leading to decreased yields and increased cost. An alternative proposed solution is to use dielectric materials of high dielectric constant. Metal oxide materials, such as barium strontium titanate, commonly referred to as BST, are known to be useful in making integrated circuit thin film capacitors having high dielectric constants. See, for example, Kuniaki Koyama et al., "A Stacked Capacitor With $(Ba_xSr_{1-x})TiO_3$ For 256M DRAM" in IEDM (International Electron Devices Meeting) *Technical Digest*, December 1991, pp. 32.1.1–32.1.4, and U.S. Pat. No. 5,122,923 issued to Shogo Matsubara et al. However, both these references use sputtering to deposit the BST, which is inherently hard to control. Such conventional processes, while useful in conventional silicon technology, when used in combination with capacitors that use metal oxides, such as BST, as the dielectric, result in capacitors that have relatively high leakage current, fatigue significantly, and generally have undesirable electrical properties. In particular, while the dielectric constant of bulk BST is of the order of 300 to 4000, the dielectric constant of thin films made according to the conventional processes is significantly lower. This is believed to be due to surface charges caused by defects and impurities in the films.

The process of spin coating has been used for making metal oxides such as barium titanate, strontium titanate, and barium strontium titanate. See G. M. Vest and S. Singaram, "Synthesis of "Metallo-organic Compounds For MOD Powders and Films", *Materials Research Society Symposium Proceedings*, Vol. 60, 1986, pp. 35–42; Robert W. Vest and Jiejie Xu, "$PbTiO_3$ Thin Films From Metalloorganic Precursors", *IEEE Transactions On Ultrasonics, Ferroelectrics, and Frequency Control*, Vol 35, No. 6, November 1988, pp. 711–717; and "Metalorganic Deposition (MOD): A Nonvacuum, Spin-on, Liquid-Based, Thin Film Method", *Materials Research Society Bulletin*, October 1989, pp. 48–53. In these papers, it was speculated that this process might have limited use for electronic devices; however, the grain size reported was 2000 Å minimum, which is as large or larger than the film thickness typically used for capacitor dielectrics in integrated circuits, and the quality of the film was inferior to that produced by other processes, such as sputtering, and thus the spin-on process as applied to these metal-oxides up to now has been limited to inks for screen printing and other macroscopic purposes. A paper given by some of the present inventors disclosed using a spin-on process to deposit BST, but does not disclose any further details of the process, and the spin-on process used yields inferior results to other fabrication processes. See "Deposition of $Ba_{1-x}Sr_xTiO_3$ and $SrTiO_3$ Via Liquid Source CVD (LSCVD) For ULSI DRAMs", given at the 1992 International Symposium on Integrated Ferroelectrics, Mar. 9–11, 1992.

Another problem associated with common integrated circuit substrates is that silicon from the substrate can migrate to the metal oxide layer of capacitors formed on the substrates. Silicon that has migrated into the metal oxide layer forms $SiO_2$ within the metal oxide layer, thereby changing the capacitance properties of the thin film high-capacitance capacitors. It would be desirable to have a barrier diffusion layer that prevents this migration of silicon into the metal oxide layer of these integrated circuit capacitors.

Recently, it has been shown that ferroelectric transistors can make excellent memories. A requirement of such memories is that the dielectric separating the ferroelectric and the gate and the ferroelectric and the channel have a relatively low dielectric constant, but have very low leakage current and a capacitance that varies little out to frequencies up to about 10 gigahertz.

Further, it would be highly desirable to have an integrated circuit dielectric material and capacitor structure that was relatively simple, utilized conventional integrated circuit materials, and still performed well at high frequencies.

3. Solution to the Problem

The present invention solves the above problems by providing metal oxide thin films on a silicon germanium substrate in which the grain size is much smaller than the thickness of the film. The average grain size of the BST grains in the thin films according to the invention is about 40 nm. Typical film thicknesses of the dielectrics in integrated circuit capacitors are 100 nm to 200 nm. Thus, the grain size in the thin films according to the invention is 2.5 to 5 times smaller than the film thickness. This small grain size results in capacitors with much improved electrical properties.

The process according to the invention preferably includes deposition of a liquid precursor by a spin-on process. Preferably, the liquid precursor is an alkoxycarboxylate precursor as described in U.S. Pat. No. 5,514,822, which is hereby incorporated by reference. The liquid precursor is dried and annealed to form the BST. Preferably, the annealing is performed at a temperature between 600° C. and 850° C.

In an exemplary embodiment, capacitors made with a dielectric material comprising BST thin films having the formula $Ba_{1-x}Sr_xTiO_3$, where x is 0.3, were found to have a dielectric constant of nearly 500 that was nearly flat out to about 10 gigahertz and a leakage current of about $10^{-9}$ amps/cm$^2$ when made by the process of the invention. The dielectric constant is about twice as large and the leakage current is about ten times as small as the best respective properties reported in the prior art for BST thin films. Numerous other features, objects and advantages of the invention will become apparent from the following description when read in conjunction with the accompanying drawings.

DETAILED DESCRIPTION OF THE PREFERRED EMBODIMENT

1. Overview

Figure 3:
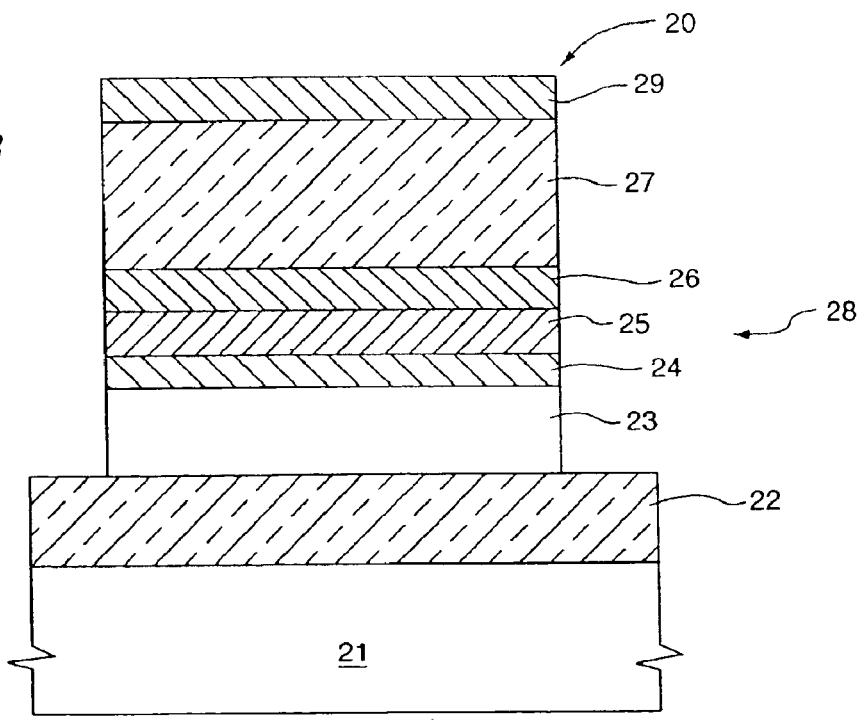
FIG. 3 is a cross-sectional view of an integrated circuit capacitor according to the invention.

FIG. 3 shows a cross-sectional view of an integrated circuit capacitor 20 according to the invention. Capacitor 20 is formed on a substrate 28 comprising a silicon germanium base substrate 21, a stress reduction layer 22, preferably formed of silicon dioxide, a doped polysilicon layer 23, an adhesion layer 24, preferably formed of titanium, and a diffusion barrier layer 25, preferably formed of titanium nitride. In this disclosure, the term "substrate" is used both in a general sense in which it means any underlying layer or layers, such as 28 referred to above, and a particular sense in which it means the base wafer, such as 21 in FIG. 3, on which the integrated circuit is made. In the general sense, any layer or group of layers in FIGS. 3–5, except the top most layer, forms a substrate for the subsequent layer or layers. Capacitor 20 comprises a first electrode 26, sometimes referred to as the "bottom electrode 26", a layer 27 of metal oxide material, and a second electrode 29, sometimes referred to as the "top electrode". Electrodes 26 and 29 are preferably made of platinum, although palladium, nickel, iridium, ruthenium, rhodium, combinations of the foregoing, and other conductors may be used.

Figure 5:
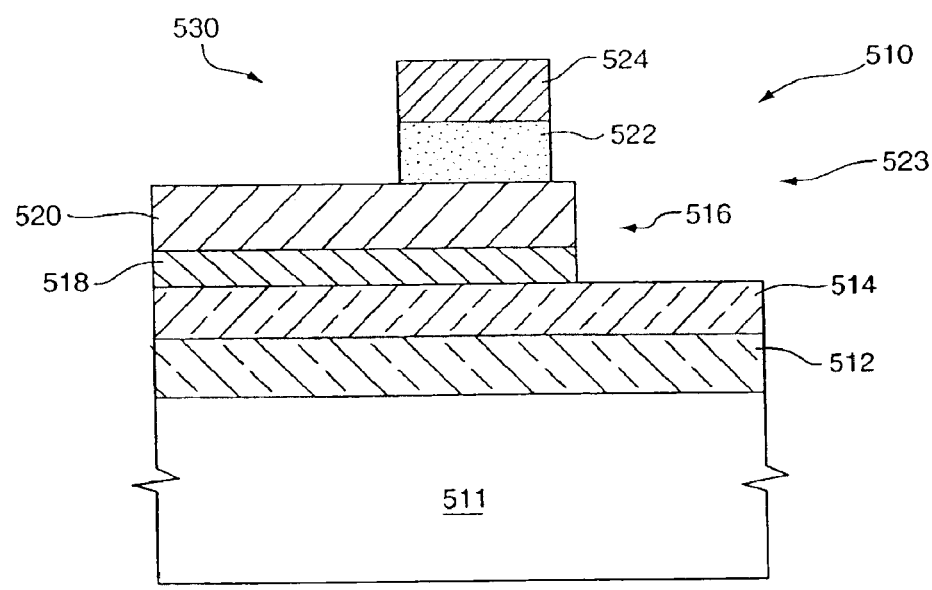
FIG. 5 is a cross-sectional view of an alternative embodiment of an integrated circuit capacitor according to the invention.

Turning to FIG. 5, a thin film capacitor 510 according to an alternative embodiment of the invention is shown. The capacitor 510 is formed on a single crystal silicon germanium wafer 511 encapsulated by a barrier layer 512, preferably of silicon nitride ($Si_3N_4$) and preferably of about 100 nm in thickness, and a stress-reduction layer 514, preferably of silicon dioxide, and preferably of about 100 nm in thickness. The capacitor 510 includes a first electrode 516 formed of an adhesion layer 518, preferably of titanium of about 200 Å thickness, and a layer 520, preferably of platinum of about 200 nanometers (nm) thickness. Capacitor 510 also includes a layer 522 of a metal oxide, such as BST, then a second electrode layer 524, also preferably about 200 nm thick and preferably made of platinum.

Figure 4:
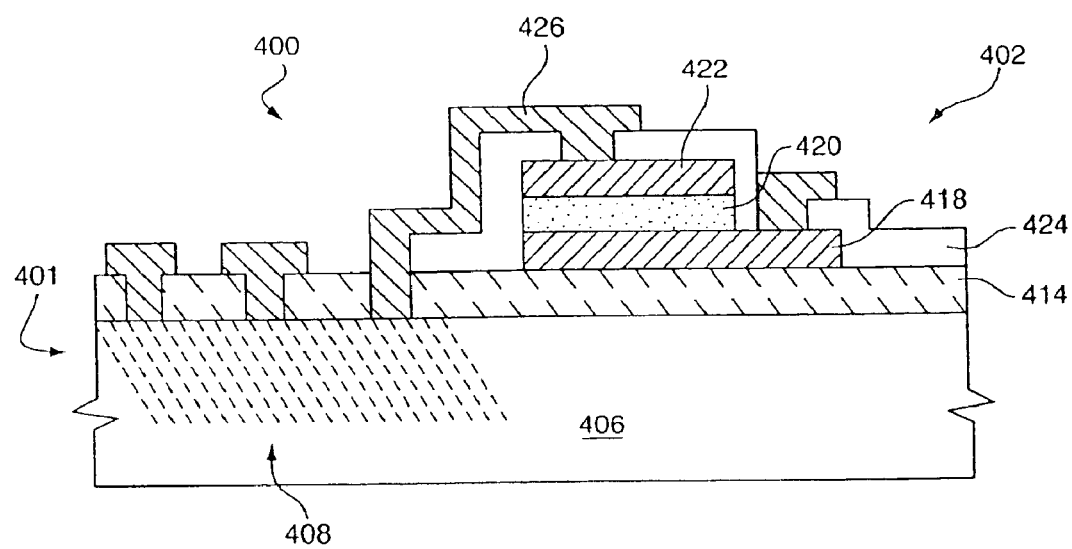
FIG. 4 is a diagrammatic representation of a section of an integrated circuit in which a thin film capacitor according to the invention is in electrical connection with a silicon germanium device portion containing a silicon germanium device.
Figure 6:
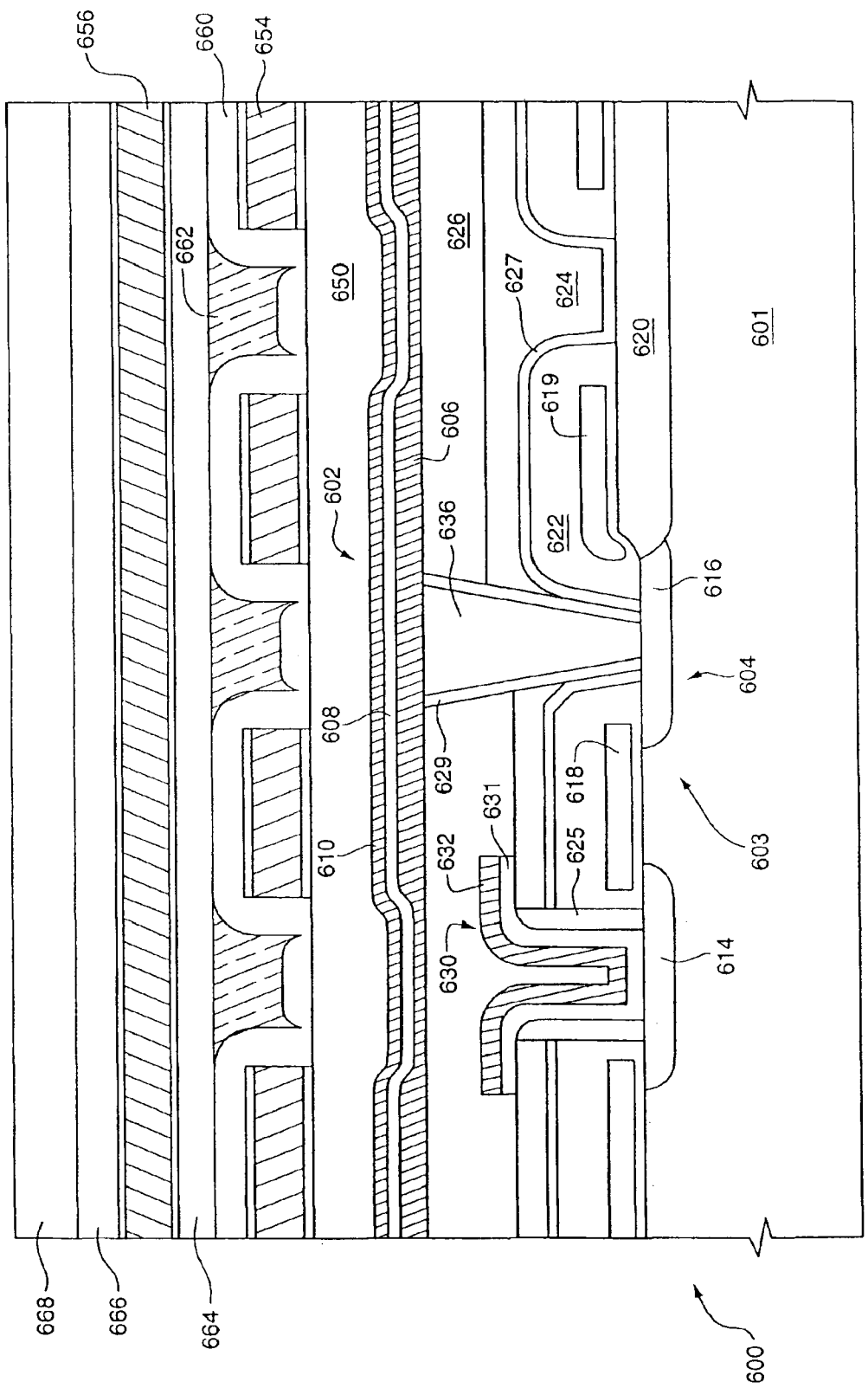
FIG. 6 is a cross-sectional view of an integrated circuit memory cell utilizing the invention and showing advantages of the invention.

FIG. 6 shows a cross-sectional view of a portion of an integrated circuit DRAM memory 600. Memory 600 includes a capacitor 602 and a transistor 604. Capacitor 602 comprises a first electrode 606, a dielectric layer 608 and a top electrode 610. Transistor 604 comprises source/drain 614, gate 618, and source/drain 616. It should be understood that FIGS. 3 and 5 depicting a capacitor and FIGS. 4 and 6 depicting an integrated circuit device are not meant to be actual plan or cross-sectional views of any particular portion of an actual capacitor or integrated circuit device, but are merely idealized representations which are employed to more clearly and fully depict the structure and process of the invention than would otherwise be possible.

Figure 1:
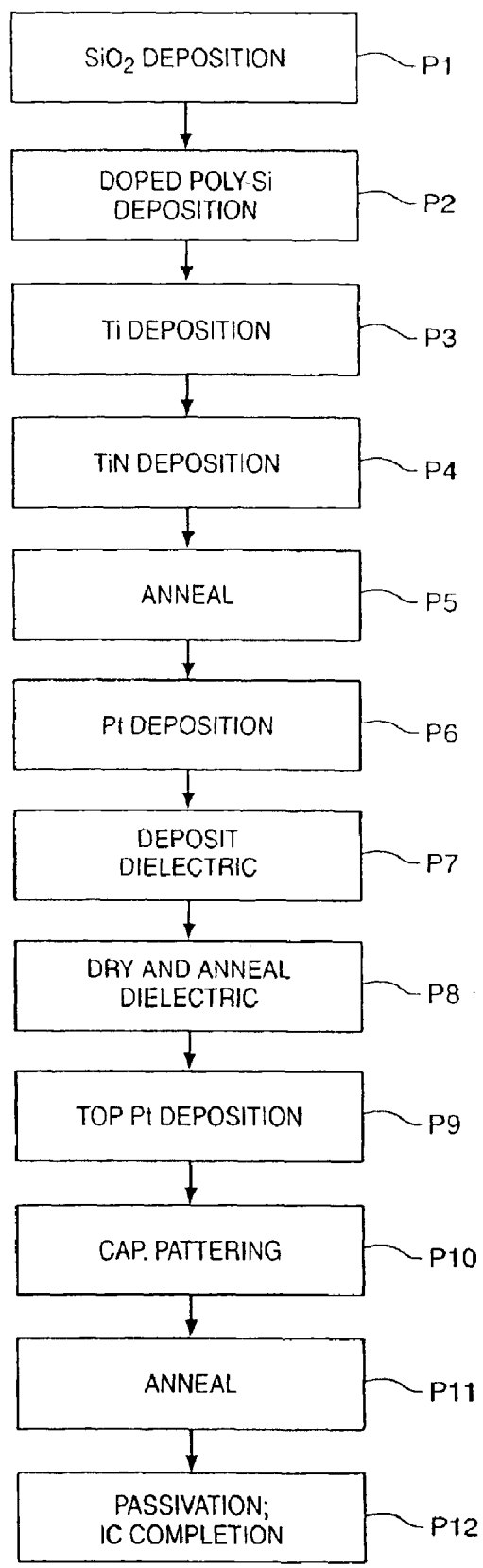
FIG. 1 is a flow chart of a process according to the invention for making a capacitor utilizing a metal oxide, such as BST, as the dielectric material.
Figure 2:
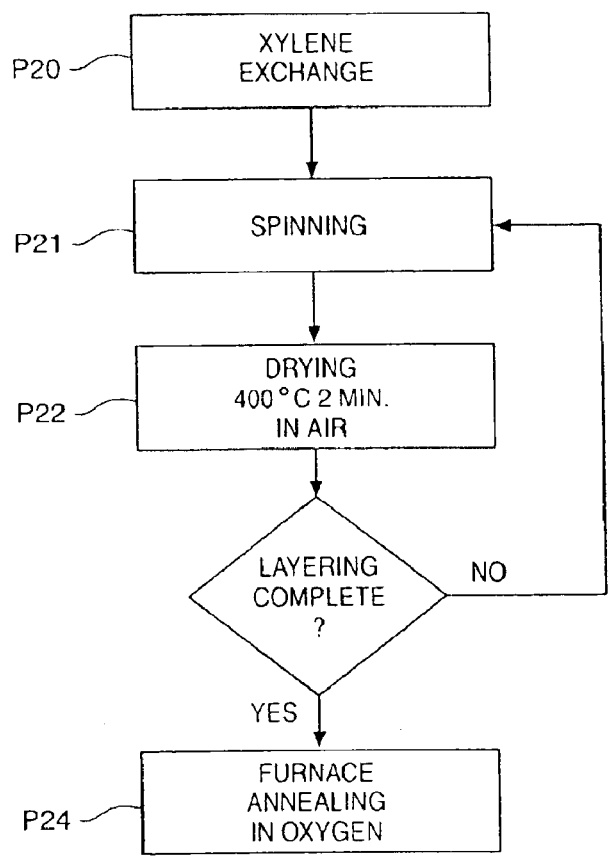
FIG. 2 is a flow chart showing the preferred metal oxide formation process.

Dielectric layers 27, 420, 522 and 608 are preferably made of a metal oxide, and most preferably, barium strontium titanate, commonly called BST, by the process of the invention, a flow chart of which is shown in FIGS. 1 and 2. It has been found that the dielectric constant of BST made according to the invention can be nearly 500, while the leakage current is as low as $10^{-9}$ $A/cm^2$ (amps per centimeter squared). In addition, the capacitance does not vary more than about 10% all the way out to about 10 gigahertz, making this an excellent capacitor for use in state-of-the-art electronic devices, such as cell phones. As a result of the excellent properties of the capacitors according to the invention, simple planar capacitors, such as capacitor 602, may be utilized in ULSI circuits, such as memory 600. This greatly simplifies the fabrication process, increases yields, and decreases costs.

2. Detailed Description of the Exemplary Embodiments

In this disclosure, the term "SiGe substrate" is defined as any semiconductor substrate containing a silicon germanium region. A silicon germanium region comprises crystal lattices in which Ge-atoms substitute for Si-atoms. The SiGe substrate may be a SiGe wafer 21, 511, or 601, as in FIGS. 3, 5, and 6, respectively, in which case the vast majority of the wafer is a silicon germanium region; or, as in FIG. 4, the SiGe substrate may be a conventional silicon semiconductor wafer 406 containing a distinct silicon germanium region 408. In a silicon germanium region, the mole ratio of silicon to germanium may be constant or it may vary spatially. The mole ratio of silicon to germanium may be expressed by the stoichiometric formula $Si_{1-x}Ge_x$, in which $0<x<1$. Typically, $0.05<x<0.5$; preferably, x is about 0.3. The mixed SiGe crystalline material in the silicon germanium region may also contain other types of atoms besides Si or Ge. For example, it is often doped with up to about 3 mole-percent carbon to reduce strain.

Turning now to a more detailed description of the invention, the capacitors 20 (FIG. 3), 402 (FIG. 4), 530 (FIG. 5) and 601 (FIG. 6) according to the invention are formed on base substrates 21, 408, 511 and 601, respectively, which base substrates are made of silicon germanium. In each case, insulating layers 22, 414, 514, etc., and/or conducting layers, such as layers 23, 518, etc., are formed between the base substrates and the capacitors 20, 400, 530 and 602. The insulating layers 22, 414 and 514, etc., are preferably made of silicon dioxide, while the layers 25 and 627 are preferably made of silicon nitride, though combinations of these materials and other insulating materials may also be used. The conductive layers 23 and 636 are preferably made of polysilicon, but may also be made of metal silicide, combinations of the foregoing, and other conductors. There usually will be an adhesion or contact layer, such as 24, between the conducting layer, such as 23, and the capacitor, such as 20. This adhesion or contact layer is preferably titanium, but may also be tantalum titanium, tantalum silicide, combinations of the forgoing, and other conductors. Often there will also be a barrier layer, such as 25, which prevents migration of materials between the underlying layers, such as 21, 22, and 23, and the capacitor, such as 20. The barrier material is preferably titanium nitride (TiN), but may also be tantalum nitride, combinations of the foregoing, and other materials. The capacitor electrodes, 26, 29, etc., are preferably formed of platinum, although palladium, nickel, iridium, ruthenium, rhodium, combinations of the foregoing, and other conductors may be used. The dielectric material 27, 420, 522, and 608 is preferably BST, but may also be a metal oxide of the form $ABO_3$, $AA'BB'O_3$, $ABB'O_3$, $AA'BO_3$, etc., a layered superlattice material, combinations of the foregoing, and other dielectrics.

A flow chart of the process for fabricating the integrated circuit capacitor 20 of FIG. 3 is shown in FIG. 1. In step P1, a silicon dioxide layer 22 is formed on silicon germanium wafer 21, preferably by thermal oxidation in an oxygen furnace. Silicon dioxide layer 22 is preferably between about 50 nm to 800 nm thick. Then, preferably, in step P2, a layer of doped polysilicon about 500 nm thick is deposited. In the examples discussed below, the doping was P-type. This layer 23 was skipped in some examples discussed below. Then follows step P3 in which a layer 24 of titanium (Ti) of about 50 nm to 60 nm thick is deposited, preferably by sputtering. In this and the other sputtering steps below, an ANELVA ILC-1015 DC magnetron 6" system was used. The sputtering power for the Ti deposition step P3 is about 1 kilowatt. Then, in step P4, a layer 25 of titanium nitride (TiN) is deposited, preferably at about 5 kilowatts of power. The thickness of this layer in various samples varied from about 90 nm to about 300 nm. In step P5, the layers deposited up to this point are annealed, preferably in a nitrogen atmosphere at a temperature from 650° C. to 850° C., from 1 to 90 minutes, and preferably about 30 minutes. To distinguish from other anneal steps, we shall refer to this anneal step as the "first anneal" or "barrier anneal". This step will be discussed in more detail in connection with the examples below. Preferably, a temperature of 800° C. is used. Then, in step P6, a layer 26 of platinum is deposited to form the first electrode 26. In the preferred embodiment, this layer 26 is between about 180 nm and 220 nm thick and is formed by DC magnetron sputtering. Then, in step P7, the dielectric 27 is deposited. Preferably, the dielectric is BST and the deposition is by spinning an alkoxycarboxylate precursor. However, other materials, such as layered superlattice ferroelectrics, may also be used. Preferably, the spinning is at between about 1500 RPM and 2000 RPM for between about 30 and 40 seconds, though this can vary depending on the viscosity of the precursor and the desired thickness of the film 27. In step P8, the dielectric is dried and annealed. This anneal shall be referred to herein as the "second anneal" or the "dielectric anneal". In the case of BST, the drying is done at about 400° C. for from 2–5 minutes. In the case of a ferroelectric, such as strontium bismuth tantalate, the drying is in two steps, one at about 150° C. for about 2 minutes and a second at about 270° C. for about 4 minutes. The drying is done in air or in nitrogen, preferably at low humidity, of about 40% or less. The annealing is preferably in oxygen at from about 600° C. to about 850° C. from 1 minute to 90 minutes, and preferably from 1 hour to 90 minutes at about 700° C. For BST, the annealing is preferably at 650° C. to 800° C. for 80 minutes, while for strontium bismuth tantalate, the annealing is preferably at about 700° C. for about 70 minutes. In some cases, an RTP anneal may precede the furnace anneal. For example, in the case of the strontium bismuth tantalate sample discussed below, an RTP anneal at 100° C./sec ramp rate and a maximum temperature of 725° C. for 30 seconds was performed after the two drying steps. The RTP is preferably performed in oxygen.

A more detailed example of the preferred process for making a BST layer 27, 408 is shown in FIG. 2. In the preferred embodiment, a xylene exchange step P20 is performed just prior to spinning. That is, the original precursor solution prepared and stored is a methoxyethanol-based solution. Just prior to use, the methoxyethanol of the original precursor solution is exchanged for xylene by adding xylene and heating to evaporate out the methoxyethanol which has a lower boiling temperature than the xylene. The xylene solution is spun on the substrate 28 in step P21 at between about 1500 RPM and 2000 RPM for between about 30 and 40 seconds, then the precursor is dried in air at between 200° C. and 500° C., more preferably between 375° C. and 425° C., and most preferably at about 400° C., for about 2 minutes. The drying temperature is significantly higher than in the prior art. The drying may also be done in nitrogen. The spinning step P21 is repeated. Preferably, it is repeated once for a total of 2 layers, though more layers could be used. After the layering is complete, the multiple layers of dried precursor on the substrate 28 are annealed in step P24 to form the BST dielectric layer 27, 408.

Turning back to FIG. 1, then follows the second electrode 29 deposition, again preferably platinum with a thickness in the range of about 180 nm to 220 nm, preferably about 180 nm thick, and preferably by sputtering. Then the capacitor is patterned in step P10, preferably by ion milling or RIE (reactive ion etching), and is annealed again in step P11, preferably at 750° C. to 800° C. for about 30 minutes in oxygen. We shall refer to this anneal as the "third anneal" or "capacitor anneal". In step P2 a passivation layer may be deposited and the integrated circuit completed. The passivation is preferably either NSG or PSG silicon glass deposited with an APCVD or LPCVD process. The passivation and other layers used are not shown in FIG. 3 as these steps were not completed in most examples to facilitate testing of the capacitors. However, these layers are shown in FIG. 6.

A precursor for barium strontium titanate (BST) having the formula $Ba_{0.7}Sr_{0.3}TiO_3$ was formulated as follows. The compounds shown in Table I were measured.

TABLE I

| Compound | FW | g | mmole | Equiv. |
|---|---|---|---|---|
| Barium | 137.327 | 9.4255 | 68.635 | 0.69986 |
| 2-ethylhexanoic acid | 144.21 | 19.831 | 137.51 | 1.4022 |
| Strontium | 87.62 | 2.5790 | 29.434 | 0.30014 |
| 2-ethylhexanoic acid | 1.44.21 | 8.5005 | 88.945 | 0.6010 |
| Titanium Isopropoxide | 284.26 | 27.878 | 98.072 | 1.0000 |

In the above table, "FW" indicates formula weight, "g" indicates grams, "mmoles" indicates millimoles, and "Equiv." indicates the equivalent number of moles in solution. The barium was placed in 100 ml (milliliters) of 2-methoxyethanol, the 2-ethylhexanoic acid was added and the mixture allowed to react while stirring. The step may also be preformed by placing the barium in the 2-methoxyethanol, allowing it to react, adding the 2-ethylhexanoic acid, and stirring while it reacts. The reaction of the barium heated the solution. While the solution was still hot, the strontium was added and allowed to react. When the strontium was all reacted, then the second measure of 2-ethylhexanoic acid was added and, while stirring, the solution was heated to a maximum temperature of 115° C. This ensures that all water is distilled out. It is noted that this precursor and others discussed below were made at atmospheric pressure at Colorado Springs, Colorado. The mixture was then allowed to cool, and the titanium isopropoxide was added followed by the addition of enough 2-methoxyethanol to make 220 ml total solution. The solution was then heated and stirred with a maximum temperature of 116° C. The solution was then diluted to 200 ml total solution with additional 2-methoxyethanol. The result was a final BST precursor of 0.490 Moles concentration with the ratio of barium to strontium equal to 0.69986:0.30014.

BST precursor solutions made as described above, except with varying ratios of the barium and strontium, were utilized to fabricate a series of capacitors. Ratios of barium and strontium were selected such that in the formula $Ba_{1-x}Sr_xTiO_3$, x had the values 0.0, 0.2, 0.3, 0.5, 0.7, and 1.0. The capacitors were fabricated as described above with reference to FIGS. 1 and 2, with the temperature of the anneals in steps P5, P8 and P11 being 750° C. and the layer 27 of BST formed in the deposition step P7 being about 140 nm (nanometers) thick. The dielectric constant of the various samples was measured and found to be about 500 with a leakage current of about $10^{-9}$ amps/cm$^2$, with the dielectric constant essentially flat out to about 10 gigahertz. Capacitors were also made using barium bismuth tantalate, barium bismuth niobate, and lead bismuth tantalate. The measured dielectric constants were two to four times lower than that of the BST, though the leakage currents were comparable to that of the BST and the capacitance also was very flat out to high frequencies. It is expected that such layered superlattice materials should have application as insulating layers in ferroelectric FETs, where low dielectric constants, low leakage currents, and flat capacitance are highly advantageous. The BST and layered superlattice material samples were examined with a transmission electron microscope (TEM) and it was found that the BST had a fine grain size of about 40 nm, which was about 3.5 times smaller than the film thickness, and the grains of the layered materials were even smaller. As is well-known in the art, grain sizes vary in any material, and thus when we say grain size herein, we mean an average grain size. The excellent quality of the films is believed to be in a large part due to this small grain size.

As indicated above, it is well-known that silicon will diffuse from the layers 21, 22, and 23 into layers 25, 26, and 27 containing metal. Since layer 27 is rich in oxygen, the silicon will form silicon dioxide, a low dielectric constant material, which degrades the dielectric constant of the capacitor. This has been found to not be as significant in silicon germanium as silicon, though the devices may still benefit from barrier layers. It is also well-known that titanium nitride (TiN) is one of the most effective barriers to silicon diffusion. Thus, a substrate 28 (FIG. 3) including a 600 Å layer 24 of Ti, a 200 nm layer 25 of TiN, and a 150 nm layer 26 of platinum was made as described in reference to FIG. 1, except that the anneal in step P5 was made at a temperature of 750° C. in an oxygen atmosphere instead of nitrogen. An effective barrier thickness, t, is between about 80 nm and 100 nm.

The above experiments indicate that a practical DRAM memory with a simple, flat capacitor structure may be made. A cross-sectional view of such a memory 600 that has been designed and fabricated is shown in FIG. 6. Memory 600 is formed on a silicon germanium wafer 601 and includes a transistor 604 and a flat, planar capacitor 602 which together form a memory cell 603. Doped areas 614 and 616 form the source/drains of transistor 604, while the gate 618 of the transistor 604 and other word line portions, such as 619, are formed of polysilicon. Field oxide regions 620 and gate oxide regions 622 insulate the gate/word line polysilicon 618. A polycide bit line 630 comprising a polysilicon layer 631 and a metal silicide layer 632 connects the source/drain 614 to external circuits. A polysilicon plug 636 connects the source/drain 616 to the first electrode 606 of capacitor 602. Silicon nitride layers 627 and 629, oxide layers 624 and 625, and BPSG (borophosphosilicate glass) layer 626 further insulate the circuit elements. The capacitor 602 includes the first or bottom electrode 606, the second or top electrode 610, and dielectric 608. The details of the capacitor structure are not shown in FIG. 6 because of the scale of the figure. However, the bottom electrode 606 is preferably a multi-layered structure of Ti/TiN/Pt as shown in FIG. 3, or may be TiSix/TiN/Pt, a four-layered structure such as TiSix/Ti/TiN/Pt, TiSix/Ta/TiN/Pt, or many other structures which include an adhesion layer 24 and barrier layer 25. Dielectric layer 608 is preferably $Ba_{0.7}Sr_{0.3}TiO_3$, but may be other formulations of BST, other high dielectric materials, such as high dielectric constant layered superlattice materials, or ferroelectric layered superlattice materials. Second or top electrode 610 is preferably formed of platinum, but may also be TiN, Ti or may be multilayered, like bottom electrode 606. BPSG layer 650 separates the capacitor 602 and the metallization layers 654 and 656 above it. First metallization layer 654 and second metallization layer 656 are preferably multilayered, with layer 654 preferably formed, from bottom to top, of Ti/TiN/Al/TiN and layer 656 formed of TiN/Al/TiN. Both layers are shown as sandwiches rather than show the details since they are not directly related to the invention herein. Plasma deposited SiO$_2$ layers 660 and 664, SOG (spin-on glass) layer 662, and PSG (phosphosilicate glass) layer 466 insulate the metallization layers 654 and 656. A passivation layer of plasma deposited silicon nitride (Si$_3$N$_4$) completes the memory 600.

In an embodiment of the invention, the SiGe substrate comprises a silicon germanium device portion. The silicon germanium device portion includes a silicon germanium device. The silicon germanium device included in the silicon germanium device portion may be a heterojunction bipolar transistor ("HBT") device. The silicon germanium device may be a MOSFET. At least part of the silicon germanium region is included in the silicon germanium device portion and in the silicon germanium device.

In a typical embodiment, the invention comprises a stress reducing field oxide layer located on the SiGe substrate between the SiGe substrate and the bottom electrode. The stress reduction layer may be directly on the silicon germanium, or located at other positions up to right adjacent the electrode. The field oxide layer may comprise silicon oxide. An embodiment of the invention may comprise a diffusion barrier layer located on the field oxide layer between the field oxide layer and the bottom electrode. The location of the diffusion barrier may also be varied from directly on the silicon germanium substrate to just below the electrode.

There has been described novel thin film metal oxide structures and processes for fabricating integrated circuit capacitors. It should be understood that the particular embodiments shown in the drawings and described within this specification are for purposes of example and should not be construed to limit the invention. Further, it is evident that those skilled in the art may now make numerous uses and modifications of the specific embodiment described, without departing from the inventive concepts. For example, equivalent materials, different material thicknesses, and other methods of depositing the substrate and electrode layers may be used. It is also evident that the process steps recited may in some instances be performed in a different order, or equivalent structures and processes may be substituted for the various structures and processes described. The structures and processes may be combined with a wide variety of other structures and processes.

We claim:

1. A method of fabricating an integrated circuit, said method comprising:
providing a silicon germanium substrate; and
forming a capacitor on said silicon germanium substrate, said step of forming a capacitor comprising depositing a thin film of barium strontium titanate having a thickness of less than 1000 nanometers and an average grain size smaller than 200 nanometers.

2. A method of fabricating an integrated circuit, said method comprising:
providing a silicon germanium substrate; and
forming a capacitor on said silicon germanium substrate, said step of forming a capacitor comprising depositing a thin film of metal oxide having a thickness of less than 1000 nanometers and an average grain size smaller than 200 nanometers.

3. A method as in claim 2 wherein said step of forming comprises forming a thin film of a thickness of 40 nm or less.

4. A method of fabricating a high capacitance thin film device, said method comprising the steps of:
providing a silicon germanium substrate;
forming a bottom electrode;
providing a liquid precursor for forming a thin film of dielectric metal oxide;
applying said liquid precursor to form a coating on said bottom electrode;
treating said coating on said bottom electrode to form said thin film of dielectric metal oxide; and
forming a top electrode on said thin film of dielectric metal oxide.

5. A method as in claim 4 wherein said step of applying comprises spinning said liquid precursor on said bottom electrode.

6. A method as in claim 4 wherein said step of treating comprises heating said coating on said electrode to a temperature of from 200° C. to 500° C.

7. A method as in claim 4 wherein said step of treating comprises heating the coating on said electrode to a temperature of about 400° C. in air or nitrogen gas.

8. A method as in claim 4 wherein said step of treating comprises annealing said coating on said electrode at a temperature of between 600° C. and 850° C.

9. A method as in claim 8 wherein said step of annealing comprises annealing at a temperature of about 700° C. in oxygen.

10. A method as in claim 4 wherein said step of treating comprises a first anneal of said thin film of dielectric metal oxide for a time between 1 minute and 90 minutes.

11. A method as in claim 10 and further including a second anneal of said thin film of dielectric metal oxide for a time between 1 minute and 90 minutes.

12. A method as in claim 4 wherein said step of treating comprises drying said liquid coating and further including the step of repeating said steps of applying said liquid precursor and drying said liquid coating one or more times until said thin film of dielectric metal oxide has a desired thickness.

13. A method as in claim 4 wherein said thin film of dielectric metal oxide comprises barium strontium titantate.

14. A method as in claim 13 wherein said barium strontium titanate has the formula $Ba_{0.7}Sr_{0.3}TiO_3$.

15. A method as in claim 4 wherein said liquid precursor comprises a metal alkoxycarboxylate.

16. A method as in claim 15 wherein said liquid precursor further comprises a metal alkoxide.

17. A method as in claim 4, further comprising a step of forming a diffusion barrier layer on said silicon germanium substrate before said step of forming a bottom electrode.

18. A method as in claim 17 wherein said diffusion barrier layer comprises $Si_3N_4$.

19. A method as in claim 18 wherein said $Si_3N_4$ has a thickness about 150 nm.

20. A method as in claim 17, further comprising a step of forming a stress reduction layer between said steps of forming a diffusion barrier layer and forming a bottom electrode.

21. A method as in claim 20 wherein said stress reduction layer comprises silicon dioxide.

22. A method as in claim 21 wherein said silicon dioxide layer has a thickness of about 100 nm.

23. A method as in claim 20 wherein said stress reduction layer is formed directly on said diffusion barrier.

24. A method as in claim 4, further comprising a step of forming a stress reduction layer on said silicon germanium substrate before said step of forming a bottom electrode.

25. A method as in claim 24 wherein said stress reduction layer comprises silicon dioxide.

* * * * *